(12) United States Patent  
Wen et al.

(10) Patent No.: US 7,737,479 B2  
(45) Date of Patent: Jun. 15, 2010

(54) IMAGE SENSOR

(75) Inventors: Tzeng-Fei Wen, Hsin-Chu Hsien (TW); Giuseppe Rossi, Los Angeles, CA (US); Ju-Hsin Yen, Taipei (TW); Chia-Huei Lin, Taipei Hsien (TW); Jhy-Jyi Sze, Tai-Nan (TW); Chien-Yao Huang, Hsin-Chu (TW); Teng-Yuan Ko, Hsin-Chu Hsien (TW); Nien-Tsu Peng, Hsin-Chu (TW)

(73) Assignees: United Microelectronics Corp., Science-Based Industrial Park, Hsin-Chu (TW); AltaSens Inc., Thousand Oaks, CA (US)

( * ) Notice: Subject to any disclaimer, the term of this patent is extended or adjusted under 35 U.S.C. 154(b) by 41 days.

(21) Appl. No.: 12/147,481

(22) Filed: Jun. 27, 2008

(65) Prior Publication Data  
US 2008/0265354 A1 Oct. 30, 2008

Related U.S. Application Data

(62) Division of application No. 11/461,457, filed on Aug. 1, 2006, now Pat. No. 7,547,573.

(51) Int. Cl.  
H01L 31/062 (2006.01)

(52) U.S. Cl. ............................ 257/294; 257/59; 257/72; 257/84; 257/222; 257/225; 257/226; 257/290; 257/291; 257/292

(58) Field of Classification Search .................. 257/59, 257/72, 84, 222, 225–226, 290–292, 294  
See application file for complete search history.

(56) References Cited

U.S. PATENT DOCUMENTS

| 6,046,444 | A | 4/2000 | Afghahi |
| 6,181,375 | B1 | 1/2001 | Mitsui |
| 6,359,323 | B1 | 3/2002 | Eom |
| 6,369,417 | B1 | 4/2002 | Lee |
| 6,472,698 | B1 * | 10/2002 | Nakashiba ................... 257/222 |
| 6,617,189 | B1 | 9/2003 | Chen |
| 6,838,298 | B2 | 1/2005 | Lee |
| 6,900,837 | B2 | 5/2005 | Muramatsu |
| 7,196,012 | B2 | 3/2007 | Hsieh |
| 7,285,764 | B2 | 10/2007 | Kuwazawa |
| 2001/0023086 | A1 | 9/2001 | Park |

(Continued)

FOREIGN PATENT DOCUMENTS

CN 1722459 A 1/2006

(Continued)

*Primary Examiner*—Kevin M Picardat  
*Assistant Examiner*—Bac H Au  
(74) *Attorney, Agent, or Firm*—Winston Hsu

(57) ABSTRACT

An image sensor, in which, a planarized layer is formed on a semiconductor substrate including a pixel array region, an optical black region, and a logic region to cover a photo sensing unit array in the pixel array region, a patterned metal layer is formed on the planarized layer corresponding to the pixel array region and the logic region, but not the optical black region. An optical black layer is formed in the optical black region after a passivation layer is formed and before a color filter array is formed at a temperature less than about 400° C., and preferably contains metal material.

8 Claims, 21 Drawing Sheets

U.S. PATENT DOCUMENTS

| | | |
|---|---|---|
| 2003/0096442 A1 | 5/2003 | Lee |
| 2005/0224853 A1 | 10/2005 | Ohkawa |
| 2006/0011813 A1 | 1/2006 | Park |
| 2006/0145222 A1 | 7/2006 | Lee |
| 2006/0175609 A1 | 8/2006 | Chan |
| 2006/0228826 A1 | 10/2006 | Kim |

FOREIGN PATENT DOCUMENTS

| | | |
|---|---|---|
| JP | 5-343656 | 12/1993 |
| JP | 11-307754 | 11/1999 |
| TW | 437057 | 5/2001 |
| TW | 437080 | 5/2001 |
| TW | 200534431 | 10/2005 |

\* cited by examiner

IMAGE SENSOR

CROSS REFERENCE TO RELATED APPLICATIONS

This is a divisional application of U.S. patent application Ser. No. 11/461,457 filed on Aug. 1, 2006, and the contents of which are included herein entirely by reference.

BACKGROUND OF THE INVENTION

1. Field of the Invention

The present invention relates to an image sensor and a method of manufacturing the same, and more particularly to, a CMOS image sensor and a method of manufacturing the same.

2. Description of the Prior Art

CMOS image sensors (CISs) and charge-coupled devices (CCDs) are optical circuit components for utilization with light signals and representing the light signals as digital signals. CISs and CCDs are used in the prior art. These two components are widely applied to many devices, including scanners, video cameras, and digital still cameras. CCDs use is limited in the market due to price and the volume considerations. As a result, CISs enjoy greater popularity in the market.

Since a CMOS image sensor device is produced using conventional semiconductor techniques, the CMOS image sensor has advantages of low cost and reduced device size. The CMOS image sensor is applied in digital electrical products including personal computer cameras and digital cameras and may be classified into a linear type and a plane type. The linear CMOS is often used in scanners and the plane CMOS is often used in digital cameras.

Please refer to FIG. 1 showing a cross-sectional diagram of a conventional CMOS image sensor 100. The image sensor 100 comprises a pixel array region 102, an optical black region 104, and a logic region 106, respectively formed on a semiconductor substrate 110. The semiconductor substrate 110 comprises a plurality of shallow trench isolations 112 and a plurality of photodiodes 114. Each photodiode 114 electrically connects with at least one corresponding MOS transistor (not shown). The shallow trench isolation 112 is used as an insulator between any two adjacent photodiodes 114.

A planarized layer 116 is formed over the semiconductor substrate 100 to cover the photodiodes 114 and the shallow trench isolations 112. Patterned metal layers 118, 120, and 122 are formed on the planarized layer 116. A planarized layer 124 is formed on the patterned metal layers. The planarized layer 124 may have a multilayer structure composed of, for example, a HDP layer (a silicon oxide layer formed by a high density plasma process) and a PETEOS layer (a silicon oxide layer formed from tetraethyl ortho silicate by a plasma enhanced chemical vapor deposition process). A passivation layer 130 is formed on the planarized layer 124 to prevent water vapor from entering the device section. A cap oxide layer 132 may be further deposited on the passivation layer 130.

Thereafter, a color filter array (CFA) 134 comprising a plurality of red, green, and blue (R/G/B) light filter patterns are formed on the cap oxide layer 132 in the pixel array region 102. A black layer 136 is positioned on the cap oxide layer 132 in the optical black region 104. A planarized layer 138 is formed on and between the CFA and the black layer. A plurality of microlenses 140 are formed on the planarized layer 138. A cap oxide layer 142 is disposed on the top to protect the microlenses 140. The metal layer 122 in the logic region 106 is exposed to the ambient air to serve as a pad for electric connection.

However, during the manufacturing process of a conventional CMOS image sensor, after the passivation layer 130 is formed, the photodiodes often have plenty of dangling bonds on the surface, leading to a current leakage (that is, dark current) problem. A conventional technique using a hydrogen annealing process is performed to solve the problem, as shown in FIG. 2 indicating an annealing step 131. However, a patterned metal layer 120 for light shielding contains metal atoms which may react with the hydrogen, and as a result, the removal of dangling bonds is impeded by the metal layer 120. Thus, a high dark current occurs.

Therefore, novel image sensor devices or manufacturing methods thereof are needed to solve the dark current problem.

SUMMARY OF THE INVENTION

An object of the present invention is to provide a manufacturing method of an image sensor device to manufacture an image sensor device having an improved dark current, as well as excellent light shielding properties in the optical black region.

Another object of the present invention is to provide an image sensor device having a relatively low dark current while still having good light shielding properties in the optical black region.

The method of manufacturing an image sensor device according to the present invention comprises the steps as follows. First, a semiconductor substrate is provided. The semiconductor substrate comprises a pixel array region, a logic region, and an optical black region between the pixel array region and the logic region. The pixel array region comprises a photo sensing unit array and a plurality of isolation structures for isolating each of the photo-sensing units. Subsequently, a first planarized layer is formed over the semiconductor substrate to cover the photo-sensing units. A patterned metal layer is formed over the first planarized layer in the pixel array region and the logic region. A second planarized layer is formed over the semiconductor substrate to cover the patterned metal layer. An optical black layer is formed over the second planarized layer in the optical black region at a temperature less than 400° C. A color filter array is formed on the second planarized layer in the pixel array region. A third planarized layer is formed on the optical black layer and the color filter array. A plurality of microlenses is formed on the third planarized layer, wherein the microlenses are positioned correspondingly over the color filter array. Finally, each layer over the metal layer in the logic region is removed to expose the metal layer in the logic region to serve as a pad.

The image sensor device according to the present invention comprises a semiconductor substrate, a pixel array region, a logic region, and an optical black region. The pixel array region is on the semiconductor substrate and comprises a photo sensing unit array. The logic region is on the semiconductor substrate and comprises a peripheral circuit. The optical black region is positioned between the pixel array region and the logic region on the semiconductor substrate and comprises a photo-sensing unit on the semiconductor substrate, a first planarized layer on the photo sensing unit, a second planarized layer on the first planarized layer, and an optical black layer on the second planarized layer.

In the method of manufacturing an image sensor device according to the present invention, a light-shielding metal layer as conventionally used in the optical black region is not formed, and instead, an optical black layer comprising metal having good light shielding properties is formed after a passivation layer is formed and before a color filter array is formed. Therefore, in the dangling bond passivation process by annealing, the passivation of the dangling bonds in the optical black region is more efficient without impedance by a conventional light shielding metal layer. Thereafter, an optical black layer can be formed from a material comprising metal at a relatively low temperature, and an image sensor device having an improved dark current can be obtained.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
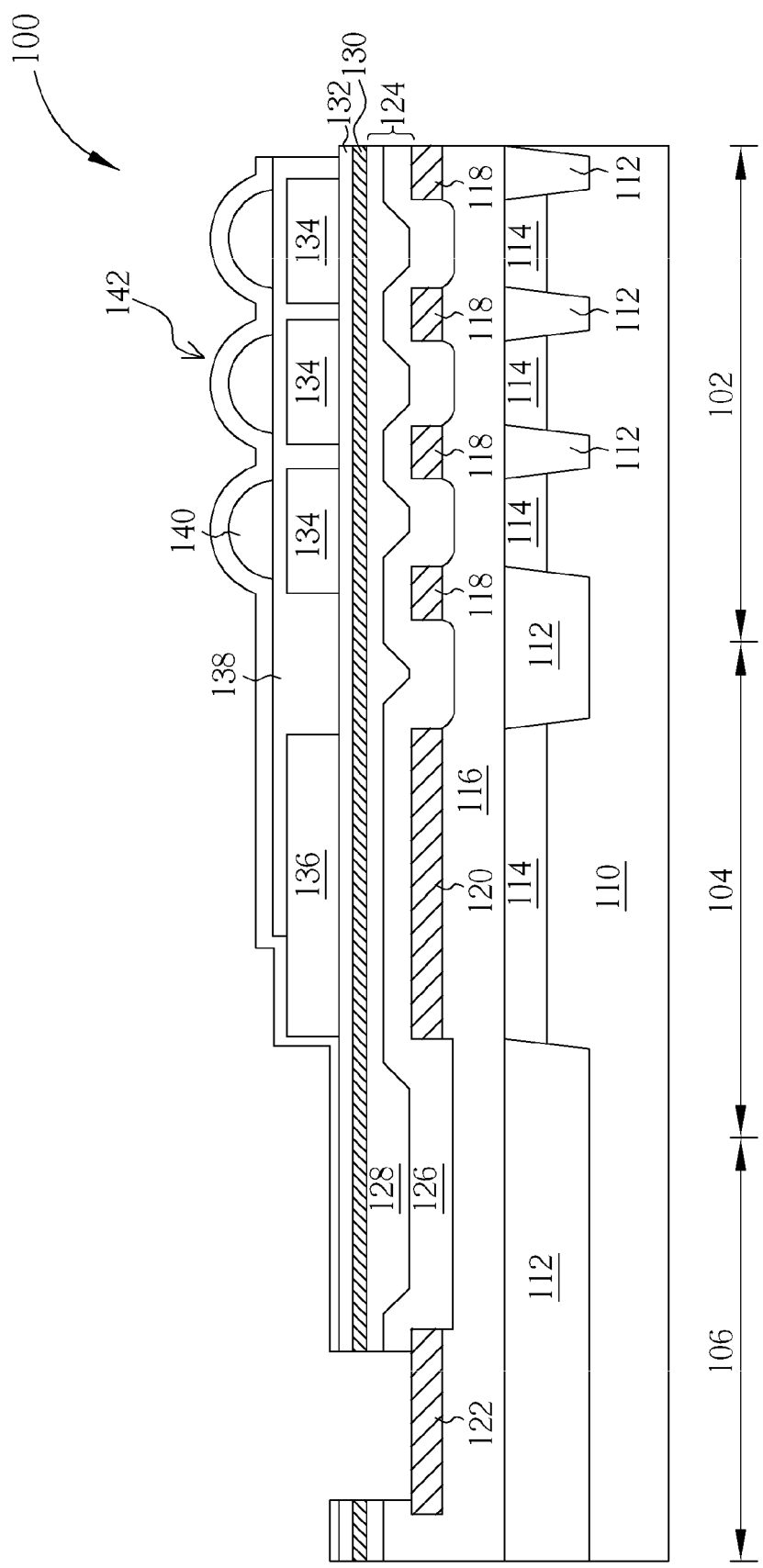
FIG. 1 is a cross-sectional diagram showing a conventional CMOS image sensor.
Figure 2:
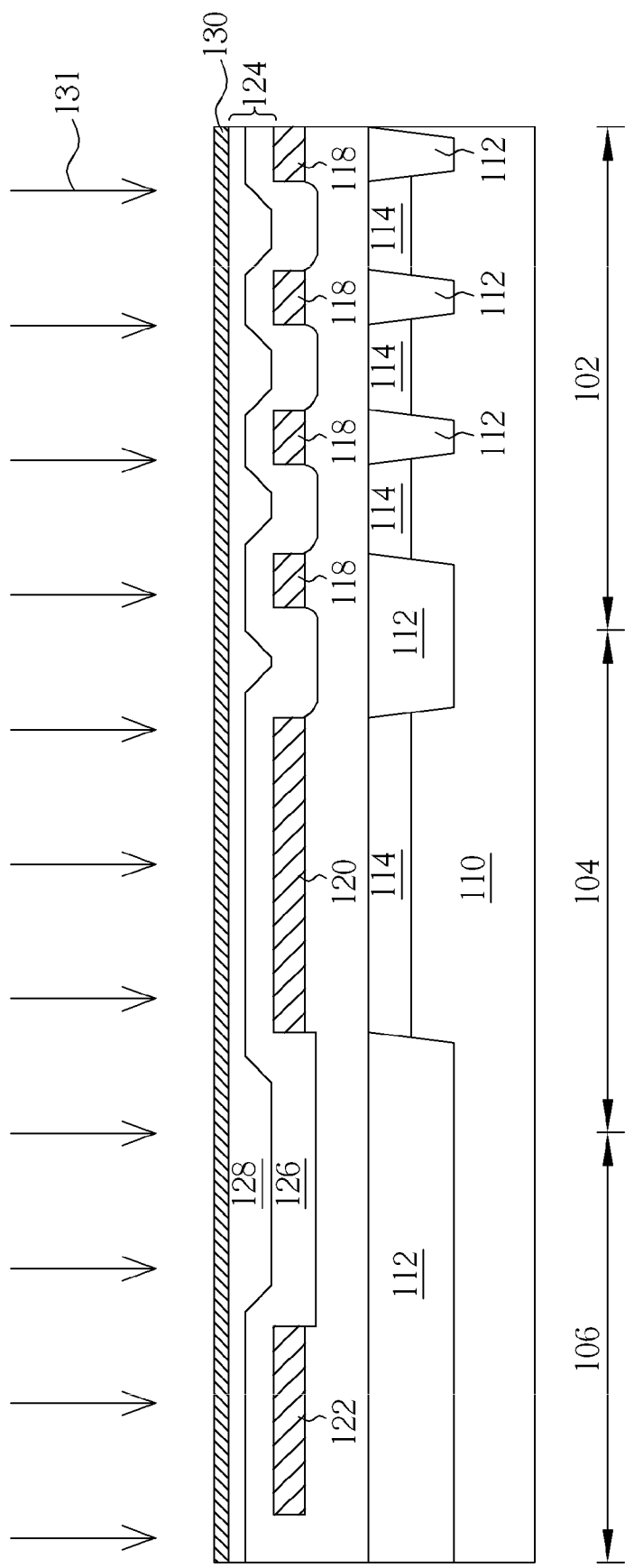
FIG. 2 shows a conventional hydrogen annealing process performed during a conventional manufacturing process of a CMOS image sensor.
Figure 3:
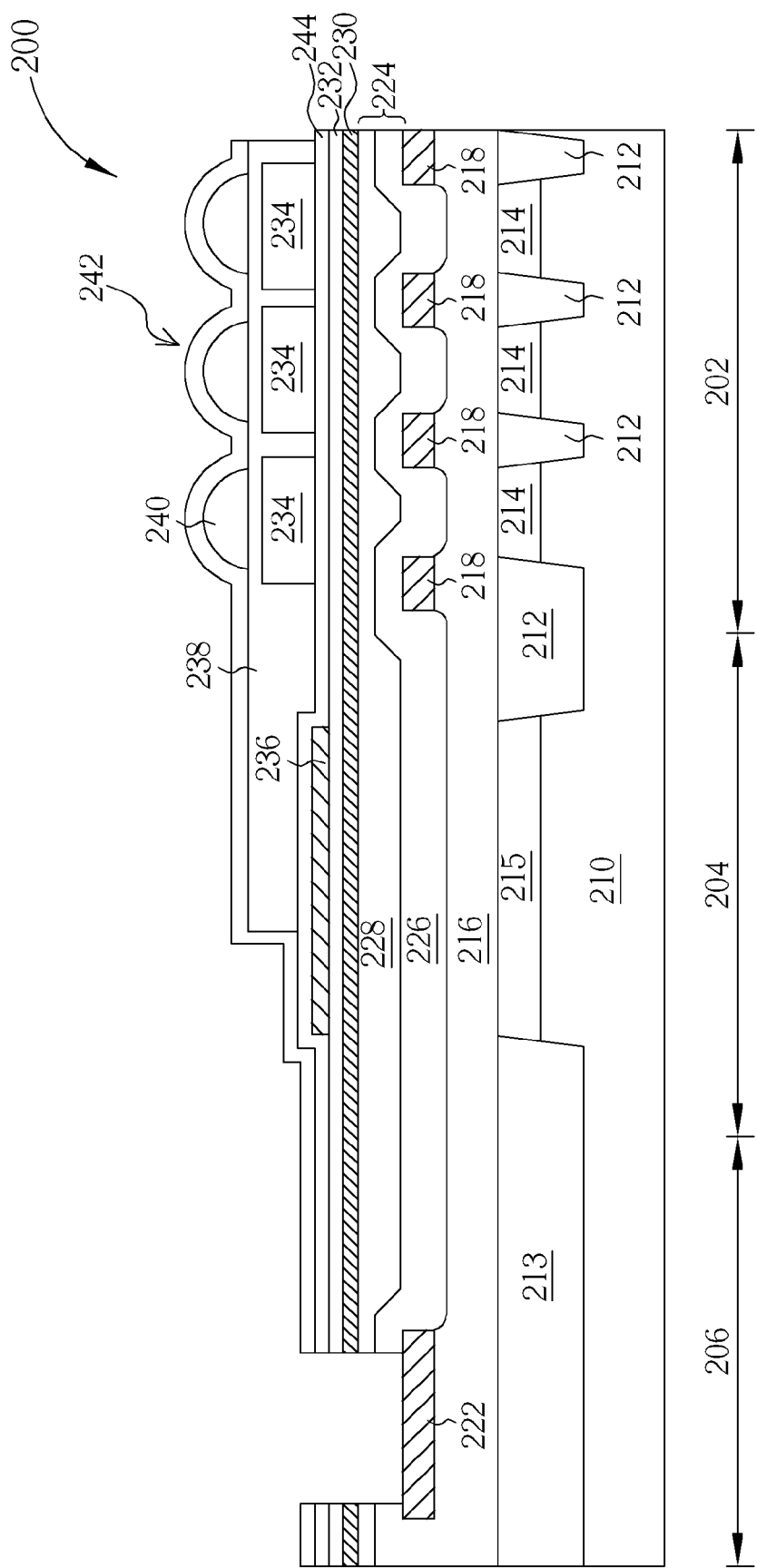
FIG. 3 shows an image sensor device according to the present invention.
Figure 4:
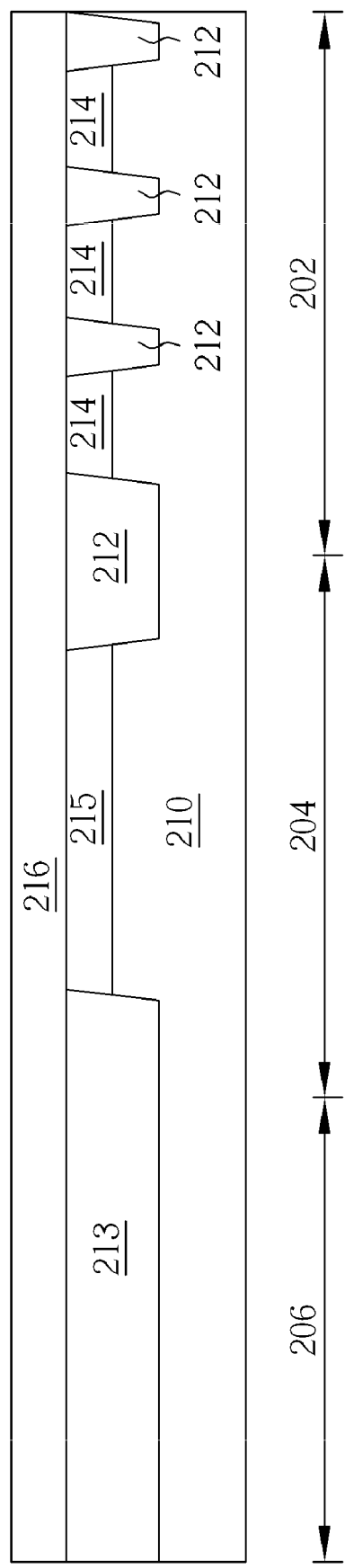
FIGS. 4 to 9 show the manufacturing method of the image sensor device according to the present invention.

Please refer to FIG. 3 showing an image sensor device 200 according to the present invention. The image sensor device 200 comprises a semiconductor substrate 210, a pixel array region 202, a logic region 206, and an optical black region 204. The pixel array region 202 is on the semiconductor substrate 210 and comprises a photo sensing unit array 214. The logic region 206 is on the semiconductor substrate 210 and comprises a peripheral circuit. The optical black region 204 is positioned between the pixel array region 202 and the logic region 206 on the semiconductor substrate and comprises a photo sensing unit 215 on the semiconductor substrate 210, a first planarized layer 216 on the photo sensing unit 215, a second planarized layer 224 on the first planarized layer 216, and a optical black layer 236 on the second planarized layer 224.

It is noted that the optical black layer 236 comprises a metal layer formed at a low temperature, for example less than 400° C. The metal layer may comprise titanium, or a combination of titanium and titanium nitride.

The photo sensing unit array 214 may comprise a photodiode correspondingly electrically connecting to at least one MOS transistor. The pixel array region 202 comprises, in addition to the photo sensing unit array 214, a plurality of isolation structures 212 used to isolate each of the photo sensing units, a planarized layer (which may be the first planarized layer 216 mentioned above) covering the photo sensing unit array 214 and the isolation structures 212, a patterned metal layer 218 as a light shielding layer on the planarized layer for light shielding, another planarized layer (may be a multilayer structure, such as the second planarized layer 224 mentioned above) on the patterned metal layer 218 on the first planarized layer, a color filter array 234 on the planarized layer corresponding to the photo sensing unit array 214, and a microlens array 240 on the color filter array 234.

The logic region 206 comprises an isolation layer 213, a planarized layer on the isolation layer 213, and a patterned metal layer 222 on the planarized layer. The planarized layer may be the first planarized layer 216 mentioned above.

Referring to FIGS. 4-9, the image sensor device 200 may be manufactured by the method described hereinafter. First, a semiconductor substrate 210 is provided. The semiconductor substrate 210 comprises a pixel array region 202, a logic region 206, and an optical black region 204 between the pixel array region and the logic region. The pixel array region 202 comprises a photo sensing unit array 214 and a plurality of isolation structures 212 for isolating each of the photo-sensing units. A photo-sensing unit 215 is on the semiconductor substrate 210 in the optical black region 204. An isolation layer 213 is on the semiconductor substrate 210 in the logic region 206. The planarized layer 216 is formed on the semiconductor substrate 210 to cover each photo-sensing unit. The planarized layer may be formed through forming a dielectric layer by a deposition method and planarizing the dielectric layer by, for example, a chemical mechanical polishing process.

Figure 5:
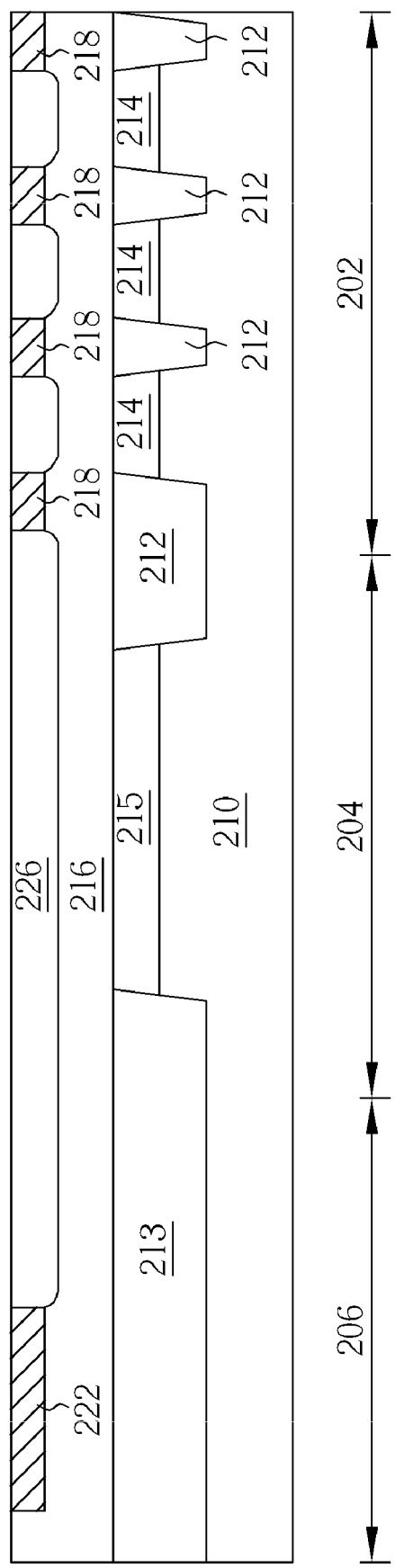

Next, referring to FIG. 5, patterned metal layers 218 and 222 are formed over the planarized layer 216 in the pixel array region 202 and the logic region 206. The patterned metal layer 218 serves as a light-shielding layer. The patterned metal layer 222 serves as a pad. The patterned metal layers 218 and 222 may be formed through forming a metal layer by sputtering and forming the pattern by etching process.

Figure 6:
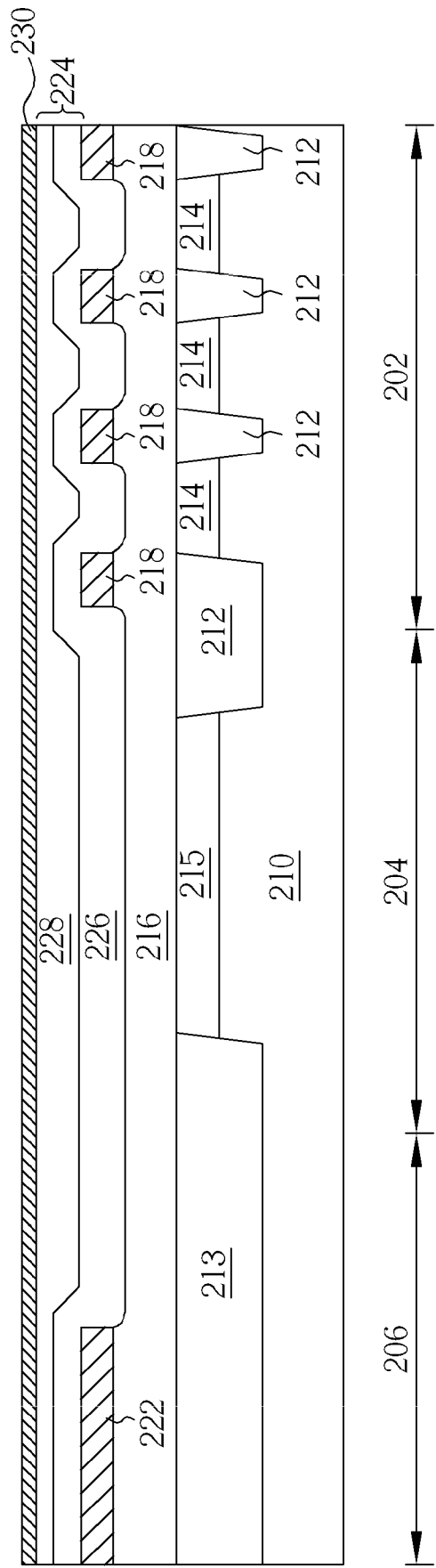

Referring to FIG. 6, a planarized layer 224 is formed over the semiconductor substrate 210 to cover the patterned metal layers 218 and 222. The planarized layer 224 may comprise dielectric material, and may be in a single or multi-layer structure. For example, the planarized layer 224 may be formed through subsequently forming a HDP layer 226 and a PETEOS 228 and planarizing the top of the PETEOS layer 228. The passivation layer 230, such as a plasma enhanced-SiN layer, may be further formed on the planarized layer 224.

Figure 7:
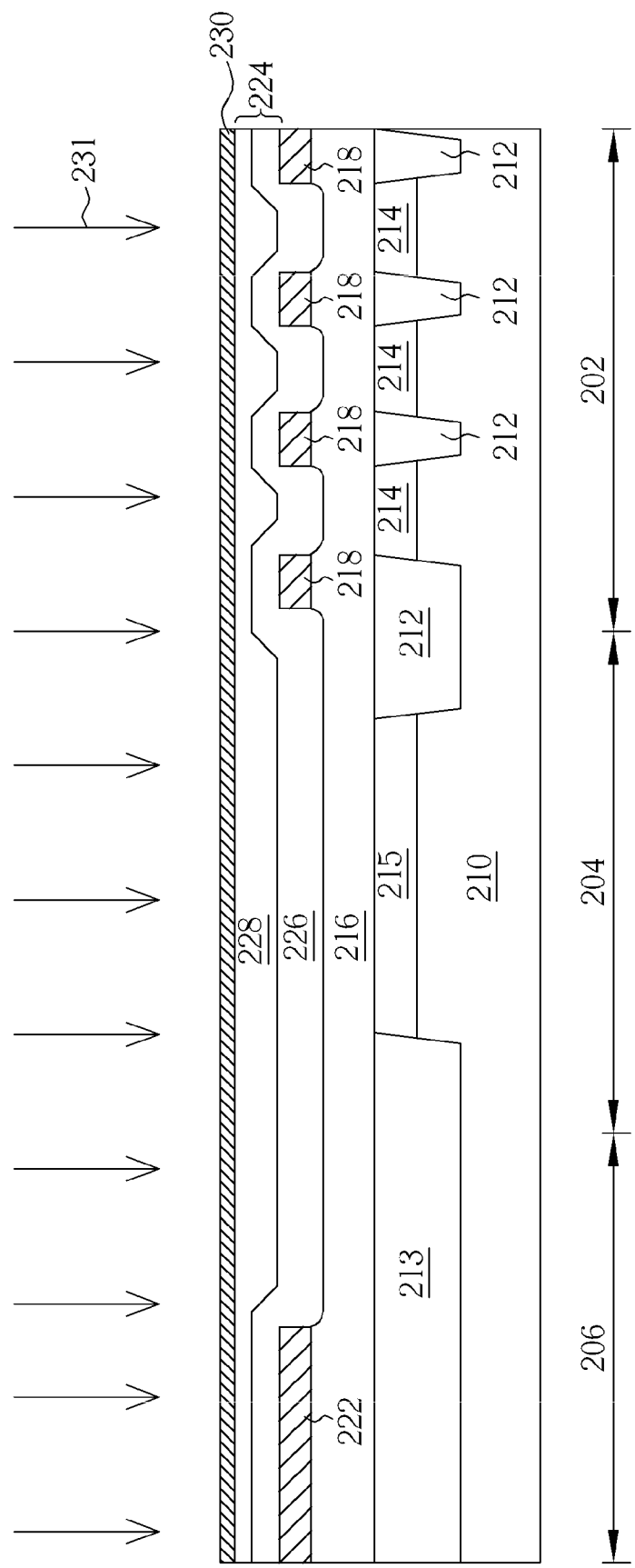

Referring to FIG. 7, after the processes as mentioned above are performed, dangling bonds, such as —Si—, and —Si—O—, etc., tend to be produced on the surface of the photodiode in the photo-sensing units 214 and 215. The dangling bonds facilitate an occurrence of dark current, and thus the measurement for light intensity is affected, that is, the sensing sensitivity for the photodiode is affected. Thus, an annealing 231 with hydrogen or other hydrogen-containing substance may be performed to allow the hydrogen molecules or atoms to be incorporated into the planarized layer and reach the surface of the photodiode to react with the dangling bonds for passivating the dangling bonds. It is noted that, in the conventional technique, when the annealing process is performed, part of the hydrogen molecules or atoms may react with metal in the metal light shielding layer having a large area located in the optical black region, and the movement of hydrogen molecules or atoms to the underneath photodiode surface is impeded. Accordingly, the resulting image sensor device still has a high dark current occurring in the optical black region. However, in the present invention, no metal light shielding layer is located over the photo sensing unit in the optical black region during the annealing process, and thus the reaction of the metal with the hydrogen molecules or atoms will not take place, such that most hydrogen can move to the surface of the photodiode, leading a more efficient passivation of the dangling bonds. Thus, the problem of dark current can be improved.

Figure 8:
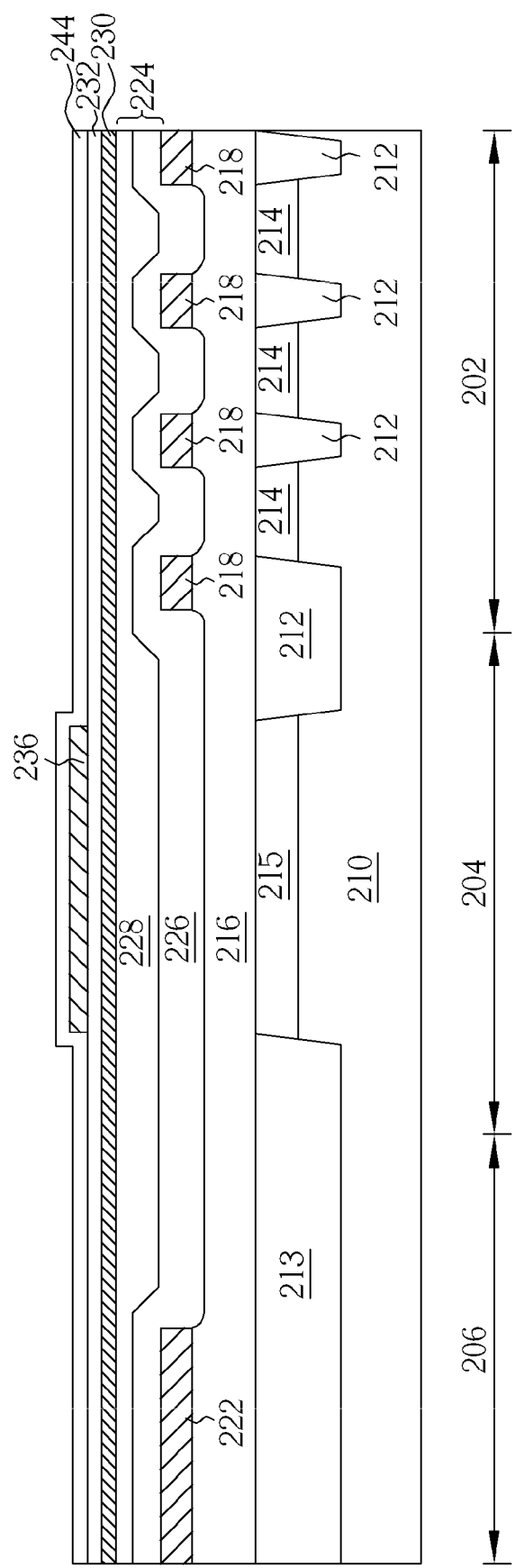

Referring to FIG. 8, an oxide layer 232, such as a plasma enhanced oxide layer, may be further formed on the passivation layer 230 after the annealing to recover the surface chemical structure of the passivation layer 230, but it is not a requisite. Next, an optical black layer 236 may be formed on the oxide layer in the optical black region. The optical black layer 236 is formed through metal sputtering process at a temperature less than 400° C. to form a low temperature metal layer. Any metal material can be formed into a film by low temperature sputtering can be used as the optical black layer of the present invention, such as titanium or the combination of titanium and titanium nitride. Then, a cap oxide layer 244 may be formed over the semiconductor substrate 210 to cover the optical black layer 236. The cap oxide layer 244 may be formed at a low temperature and may comprise a plasma enhanced oxide layer to recover the damaged surface in previous processes, such as sputtering, and provide protection.

Figure 9:
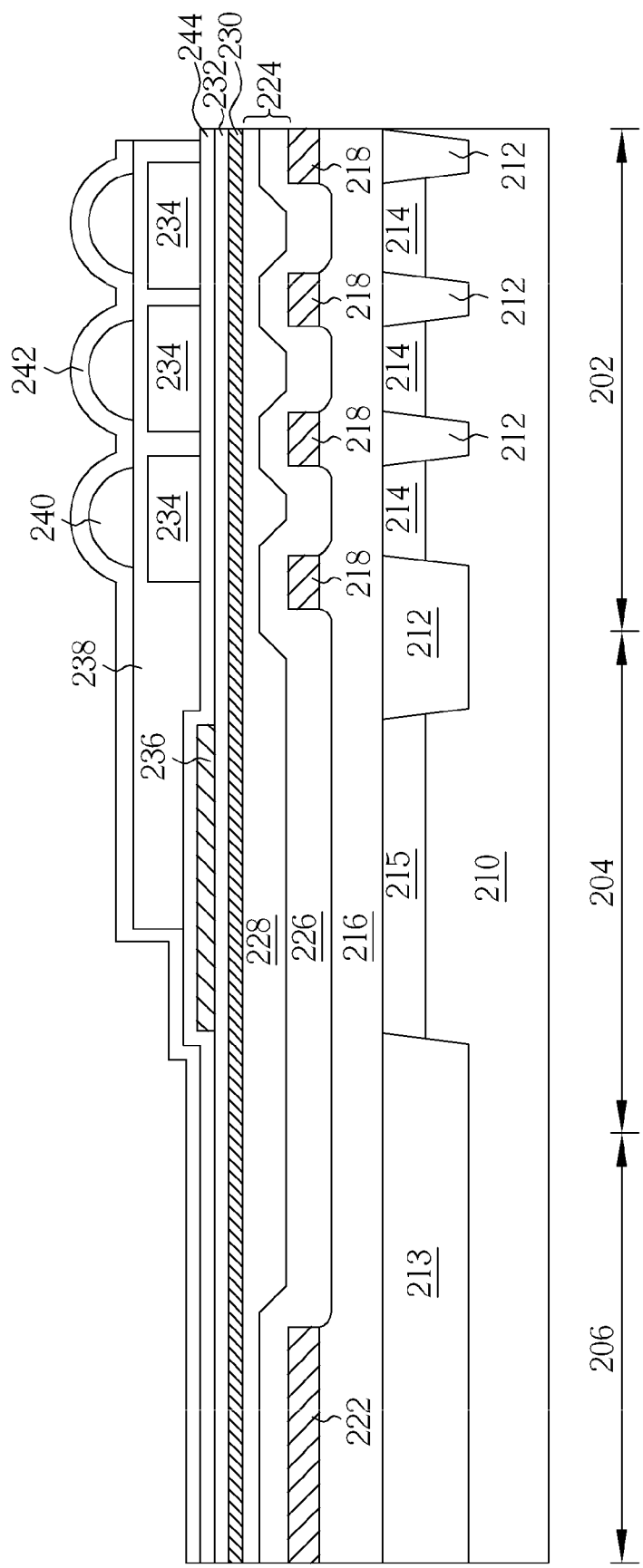
Figure 10:
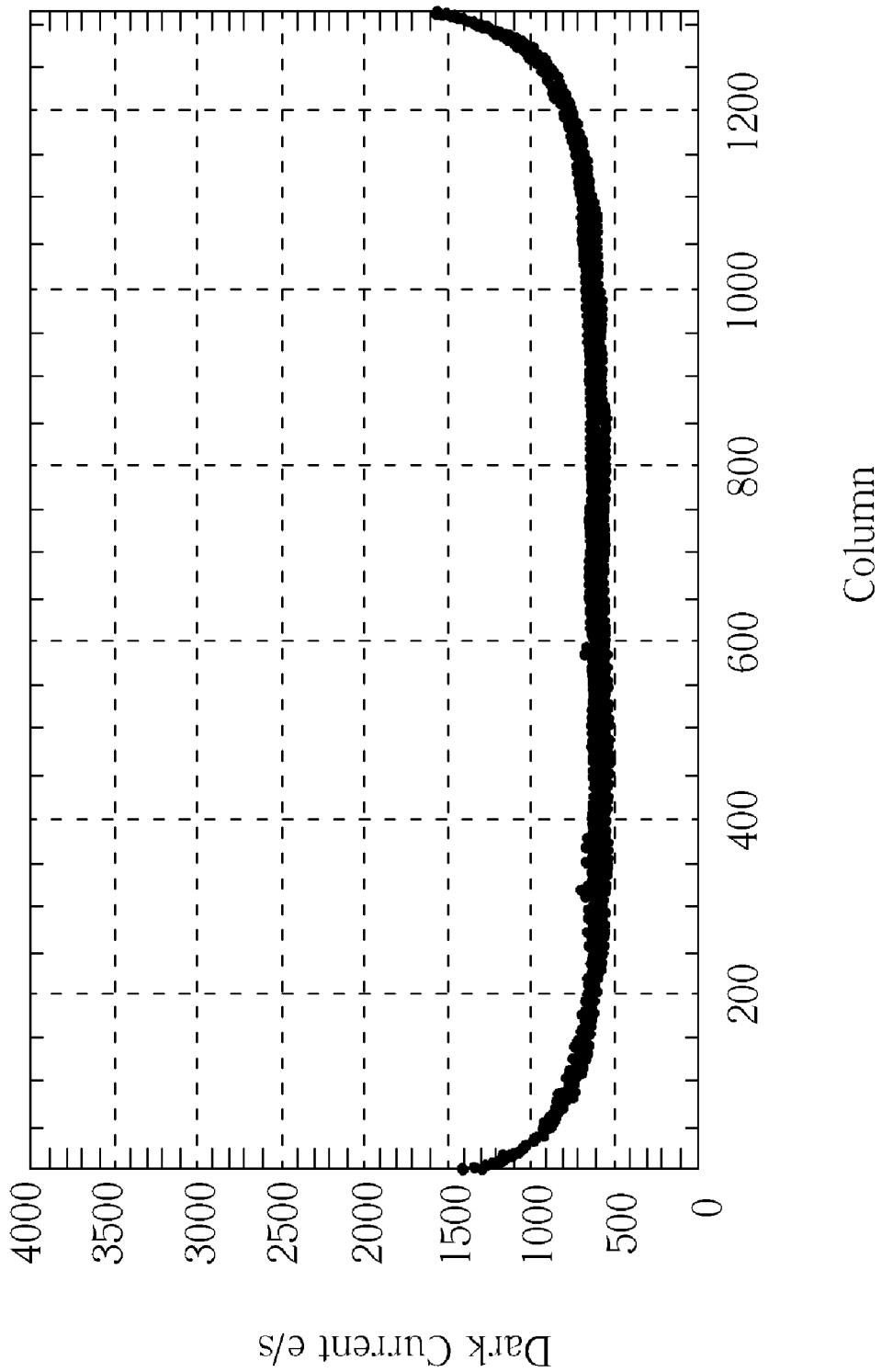
FIGS. 10 to 21 show a result of measuring a dark current on various locations of the image sensor device.
Figure 11:
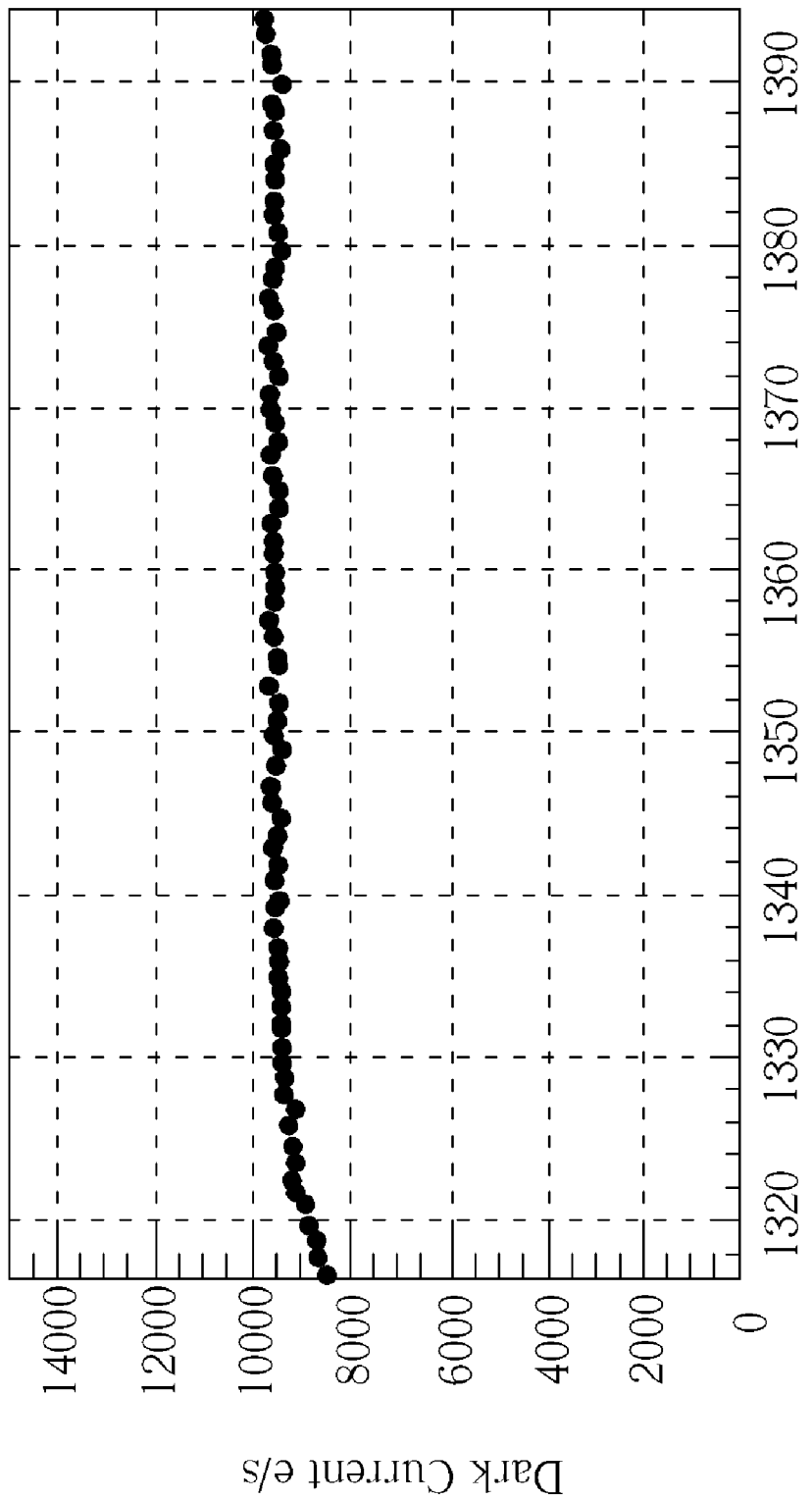
Figure 12:
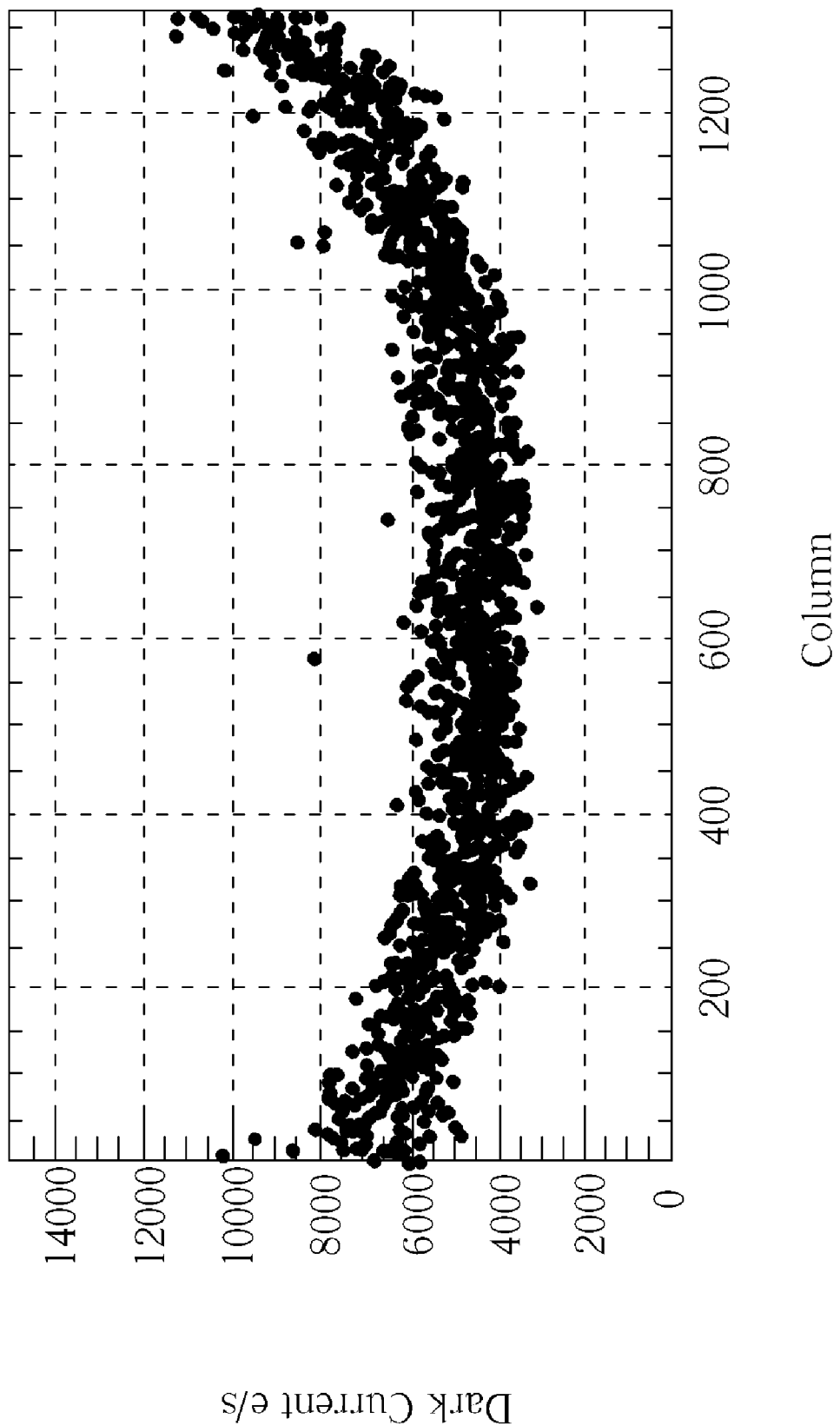
Figure 13:
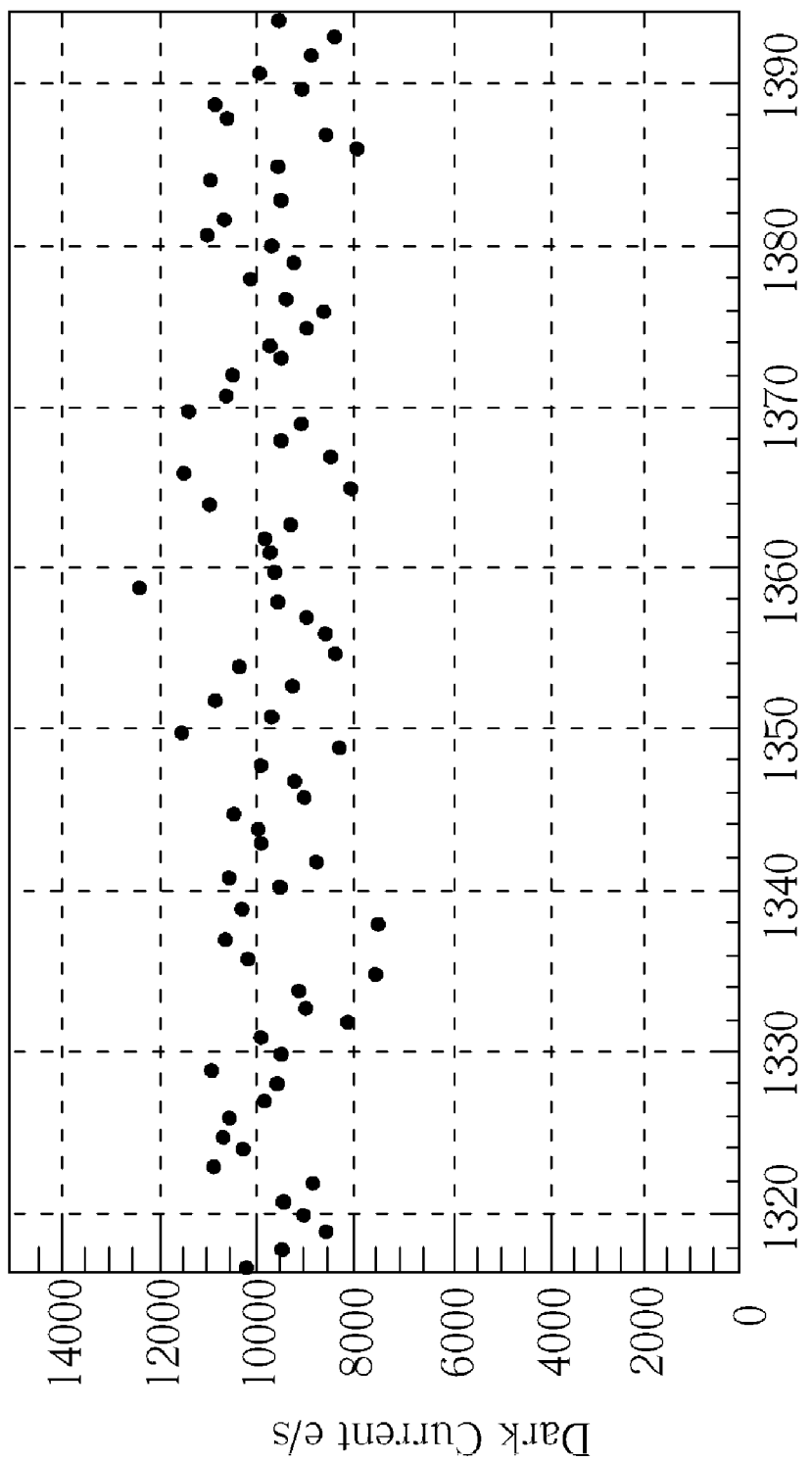
Figure 14:
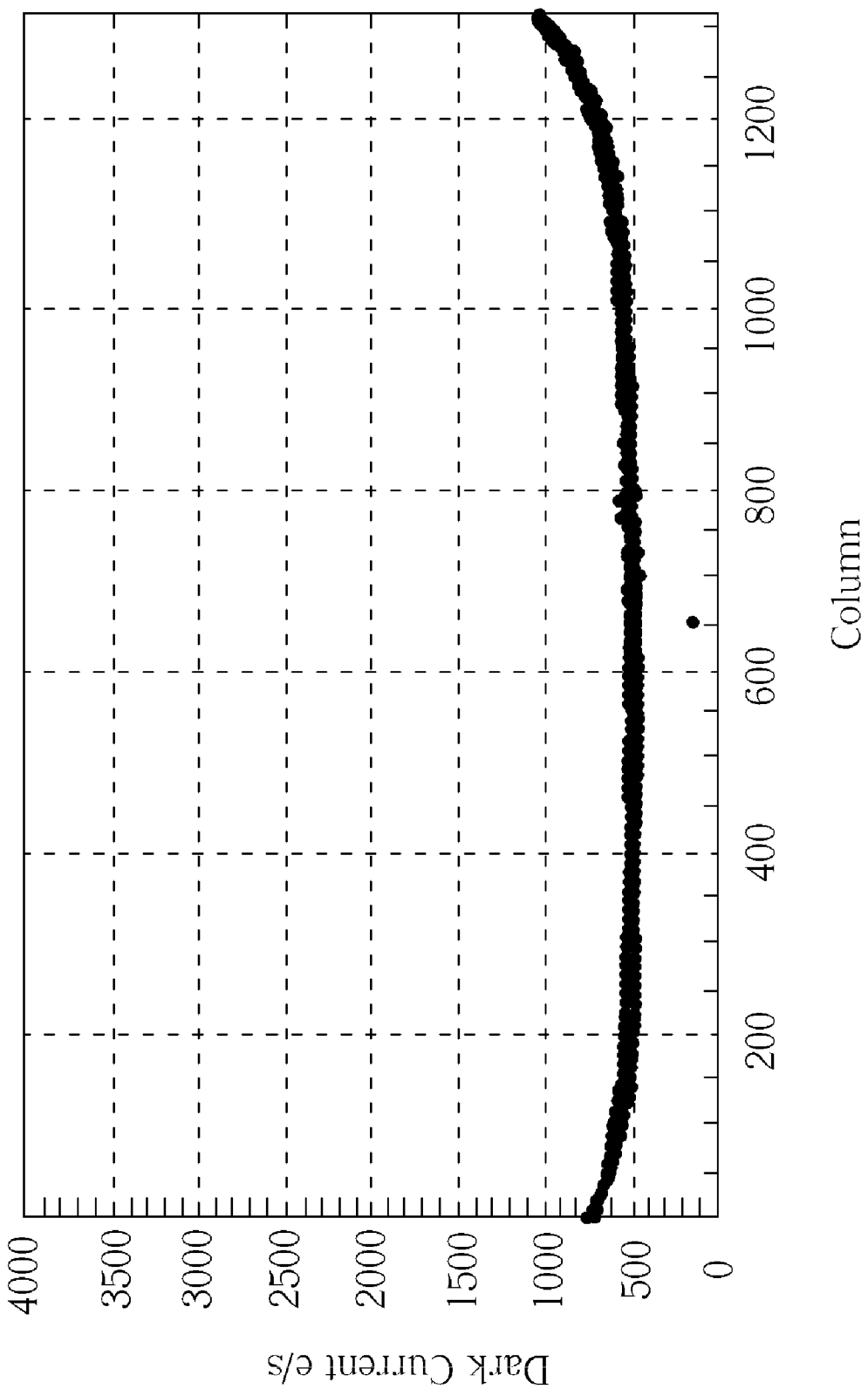
Figure 15:
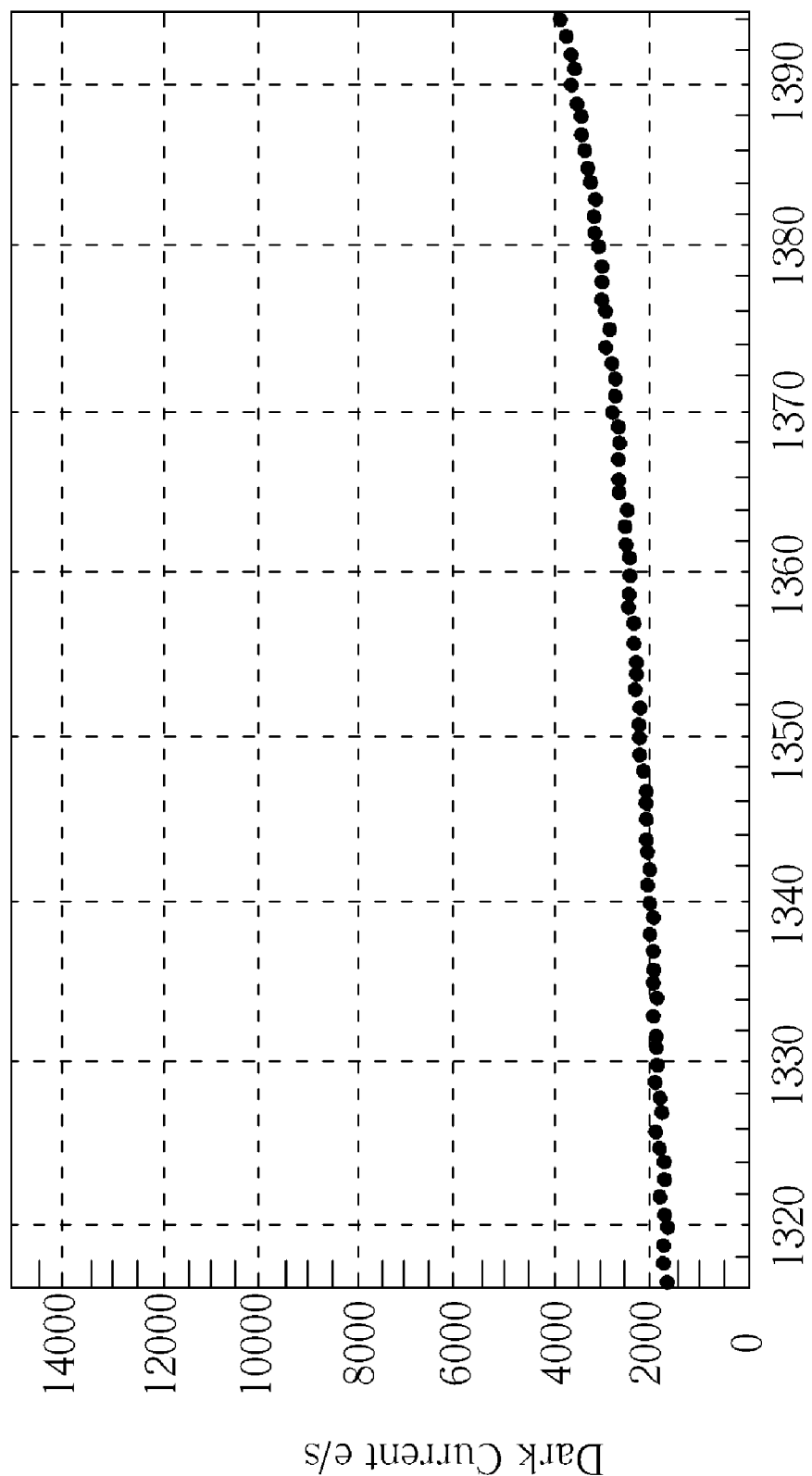
Figure 16:
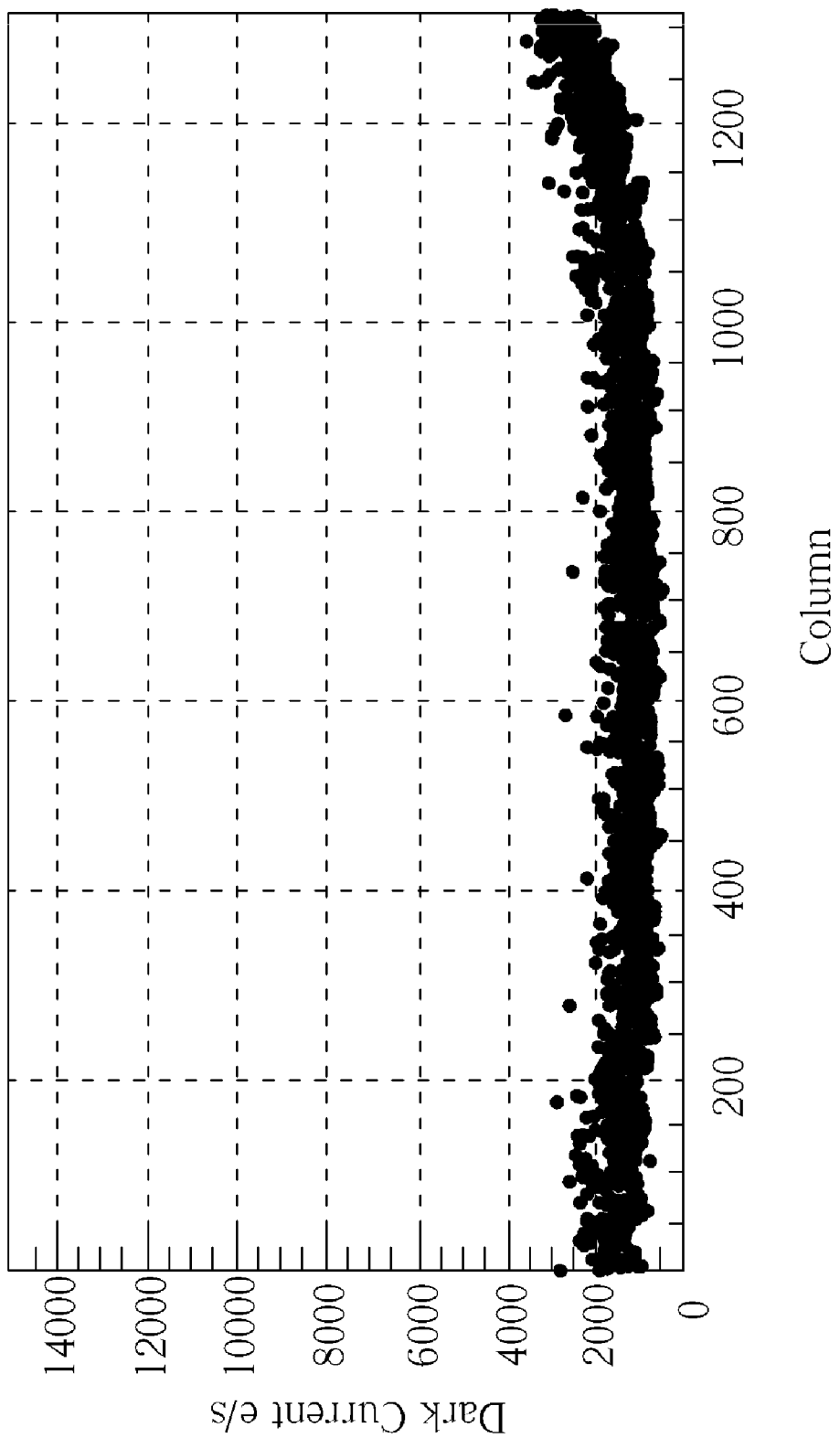
Figure 17:
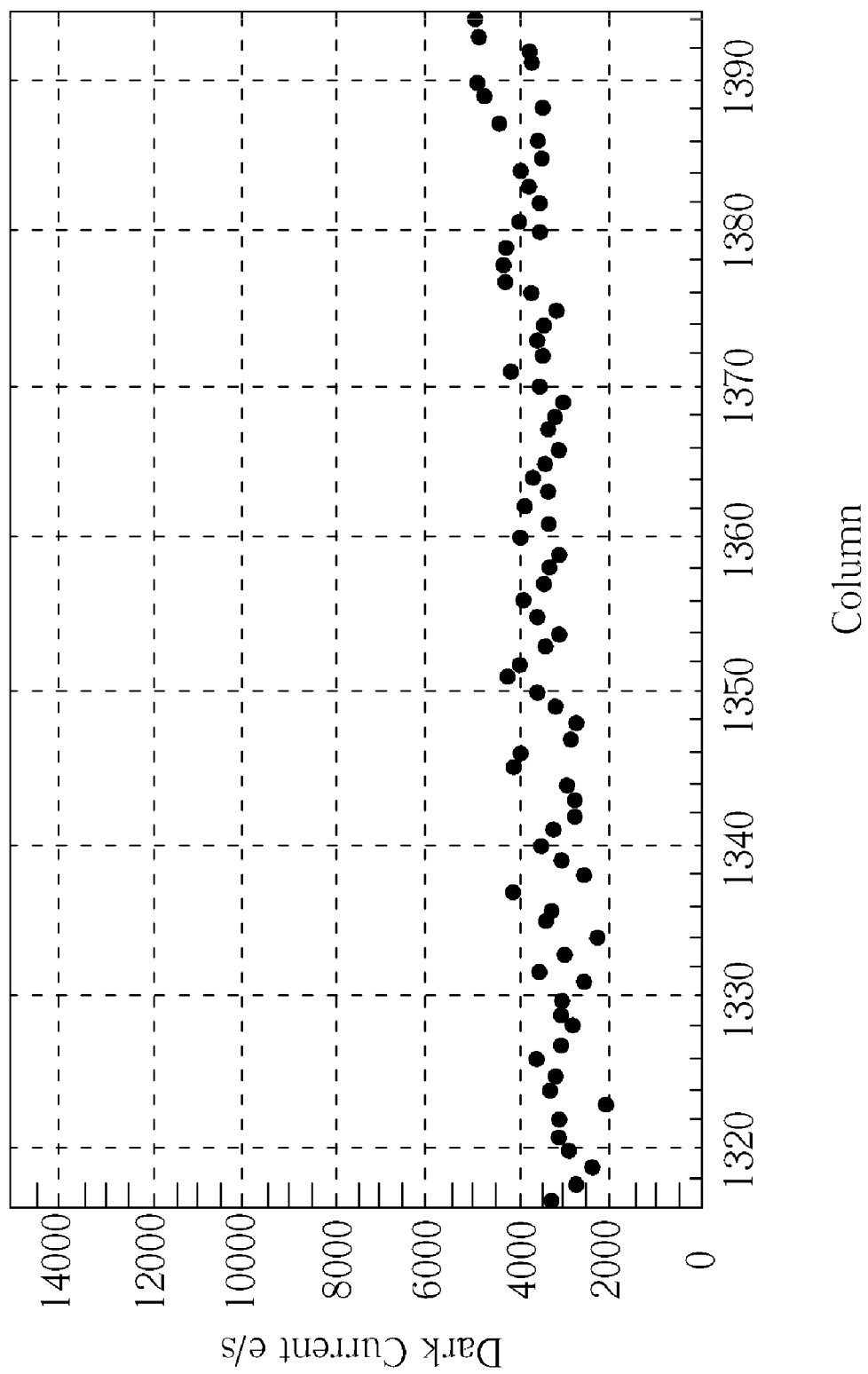

Referring to FIG. 9, a color filter array 234 is formed on the planarized layer 224 or the cap oxide layer 244 (if formed) in the pixel array region, that is, a red light filter array, a green light filter array, and a blue light filter array are sequentially formed over the corresponding photodiodes. Thereafter, a planarized layer 238 is formed over the color filter array 234 and part of the optical black layer 236. Thereafter, a plurality of microlenses 240 are formed on the planarized layer 238 at the position corresponding to the color filter array 234. The microlenses may be formed through forming a polymeric layer (not shown) from an acrylate material, and performing an exposure, a development, and a reflow process on the polymeric layer. A planarized layer, such as cap oxide layer 242, may be further formed over the microlenses and in the optical black region for surface protection.

Finally, each layer, such as the planarized layer 224, the passivation layer 230, the oxide layer 232, and the cap oxide layers 244 and 242, over the patterned metal layer 222 as a pad in the logic region 206 may be removed using for example an etching process to expose the patterned metal layer 222 in the logic region 206 to serve as a pad for electric connection. Thus, an image sensor device according to the present invention can be accomplished.

Alternatively, the step of removing each layer over the patterned metal layer 222 in the logic region 206 may be performed after forming the planarized layer 224 or the passivation layer 230 to remove the planarized layer 224 or the passivation layer 230 by for example mask and etching processes. Finally, after the cap oxide layer 242 is formed, each layer over the patterned metal layer 222 is removed again to reopen the patterned metal layer as a pad.

It is noted that steps after the annealing process for dangling bond passivation are preferably performed at a low temperature less than the annealing temperature, such as 400° C., to avoid spoiling the dangling bond passivation performed in the previous process.

The image sensor device obtained by the method of the present invention has a relatively low dark current. Please refer to FIGS. 10-21, showing a result for measuring dark current produced at various positions of the image sensor device. The ordinate is dark current represented by electrons per second. The abscissa is the column number of the image sensor device.

FIGS. 10-13 respectively show the measurement result of dark current at the pixel array region, the optical black region at the right end of the pixel array region, the optical black region at the bottom of the pixel array region, and the optical black region in the right bottom corner of the device of a conventional image sensor device. The image sensor device uses a metal light shielding layer in the optical black region and an hydrogen annealing was performed at a flow ratio of hydrogen:nitrogen=0.8:20 to passivate dangling bonds after the metal light shielding layer was formed during the manufacturing. The curves shown in FIGS. 10 and 12 arise significantly in two ends, indicating that the dark current at the edge part is high. The curves shown in FIGS. 11 and 13 indicate that the dark current in the optical black region is very high, and there is a significant difference between the dark current in the pixel array region and the dark current in the optical black region.

FIGS. 14-17 respectively show the measurement result of dark current at the pixel array region, the optical black region at the right end of the pixel array region, the optical black region at the bottom of the pixel array region, and the optical black region in the right bottom corner of the device of a conventional image sensor device. The image sensor device uses a metal light shielding layer in the optical black region and an hydrogen annealing was performed at a flow ratio of hydrogen:nitrogen=2:20 to passivate dangling bonds after the metal light shielding layer was formed during the manufacturing. The curves shown in FIGS. 14 and 16 arise significantly in two ends, indicating that the dark current at the edge part is high. The curves shown in FIGS. 15 and 17 indicate that the dark current in the optical black region is high to be about 2000 to 4000 e/s, and there is a significant difference between the dark current in the pixel array region and the dark current in the optical black region.

Figure 18:
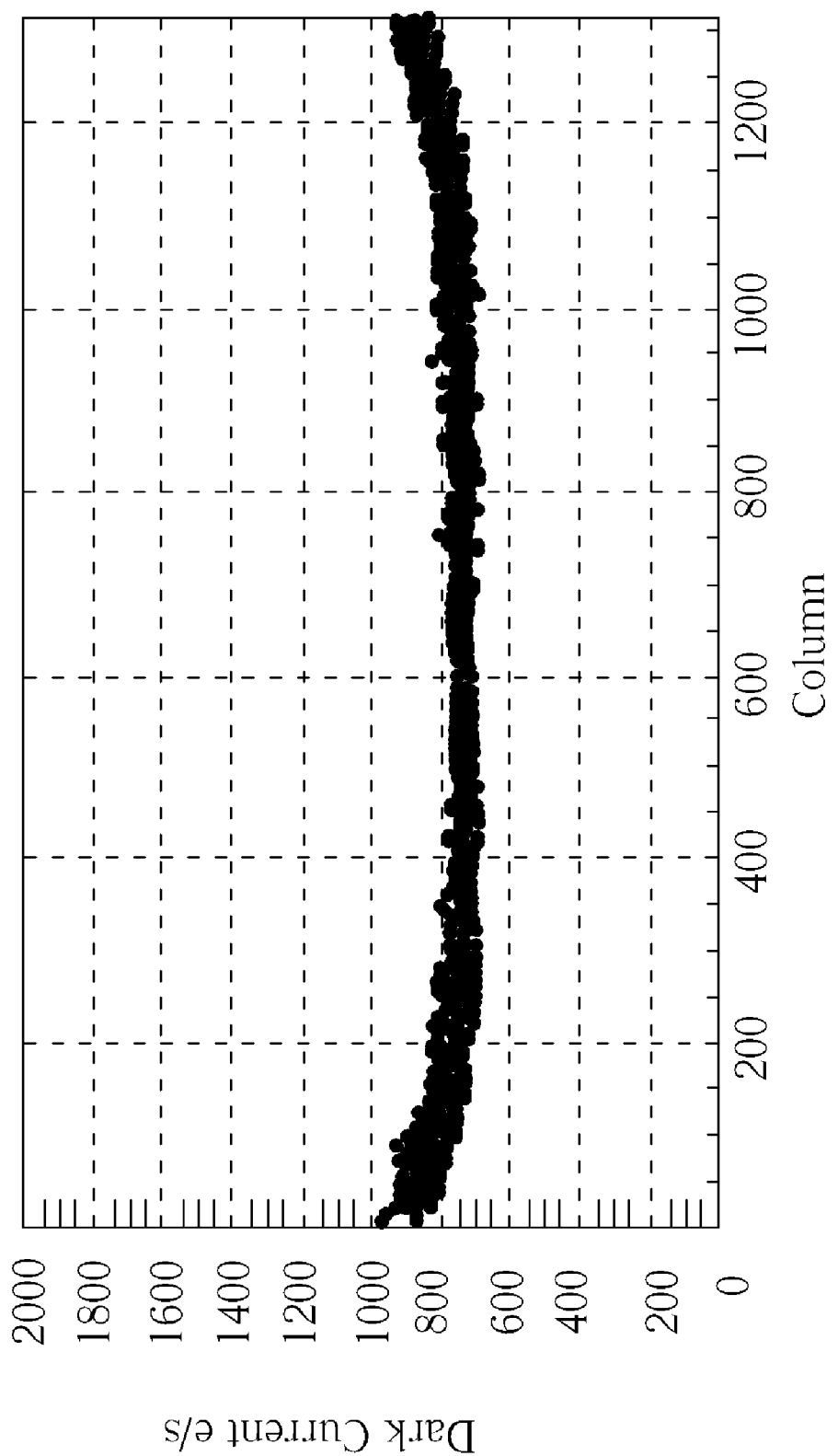
Figure 19:
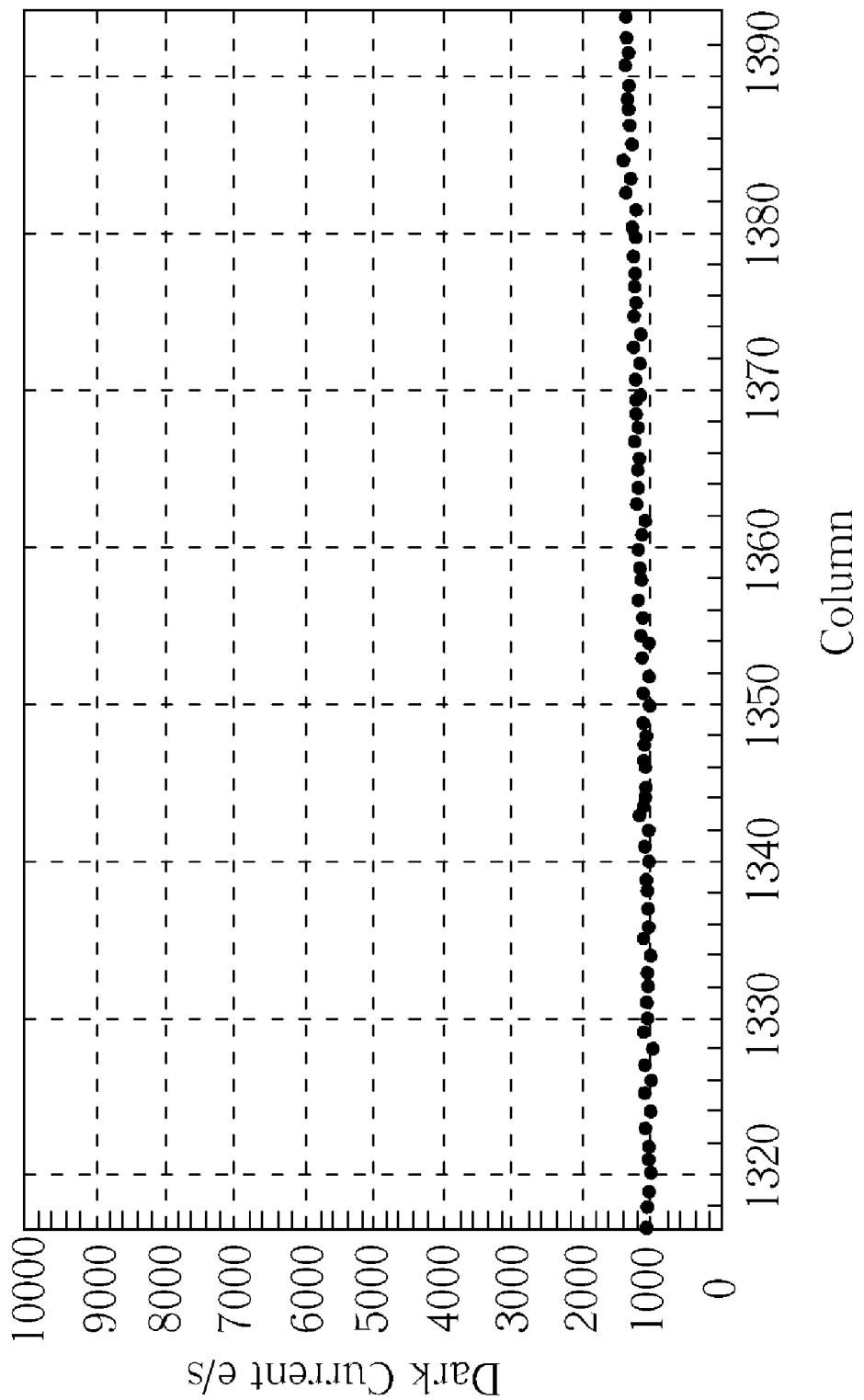
Figure 20:
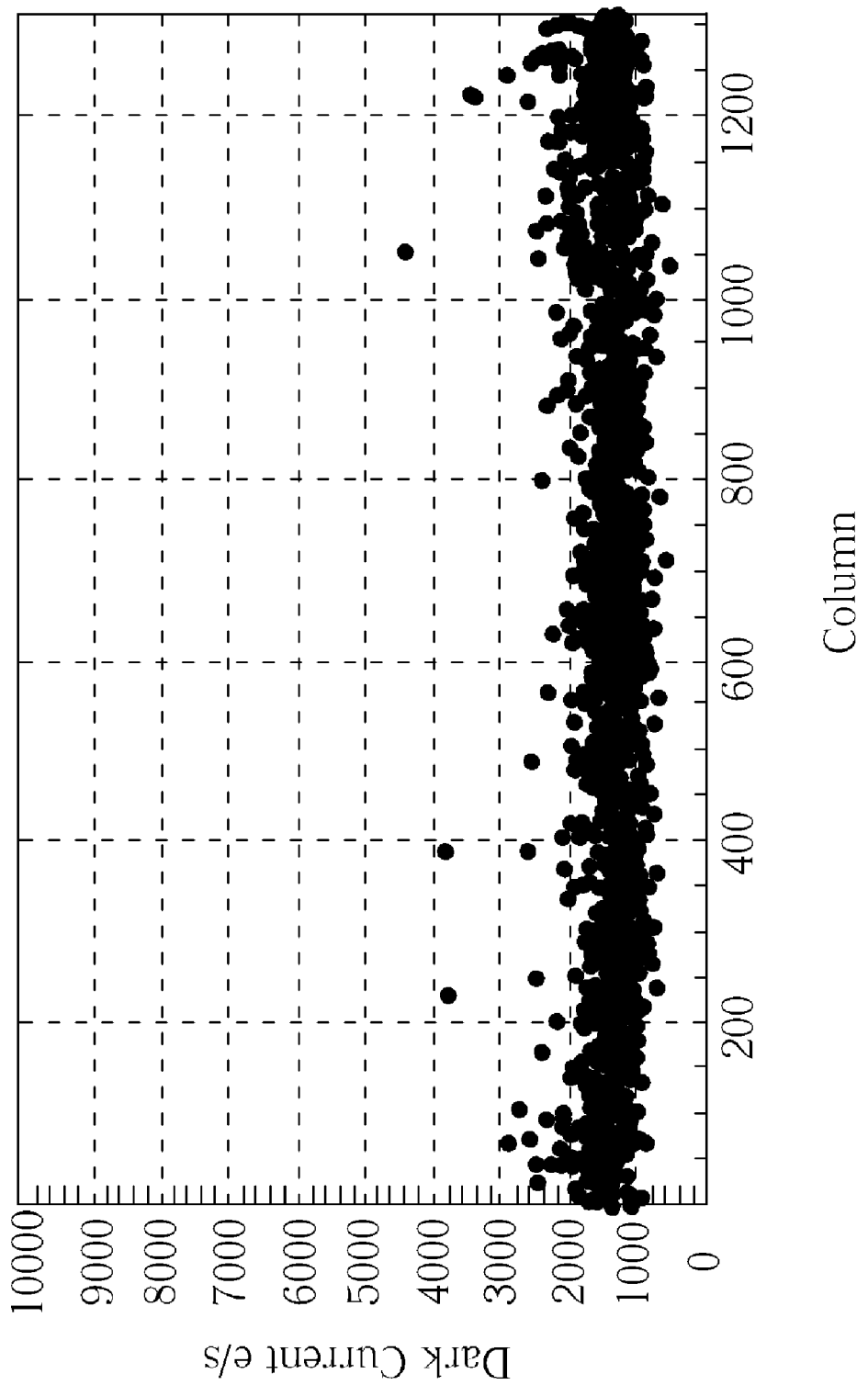
Figure 21:
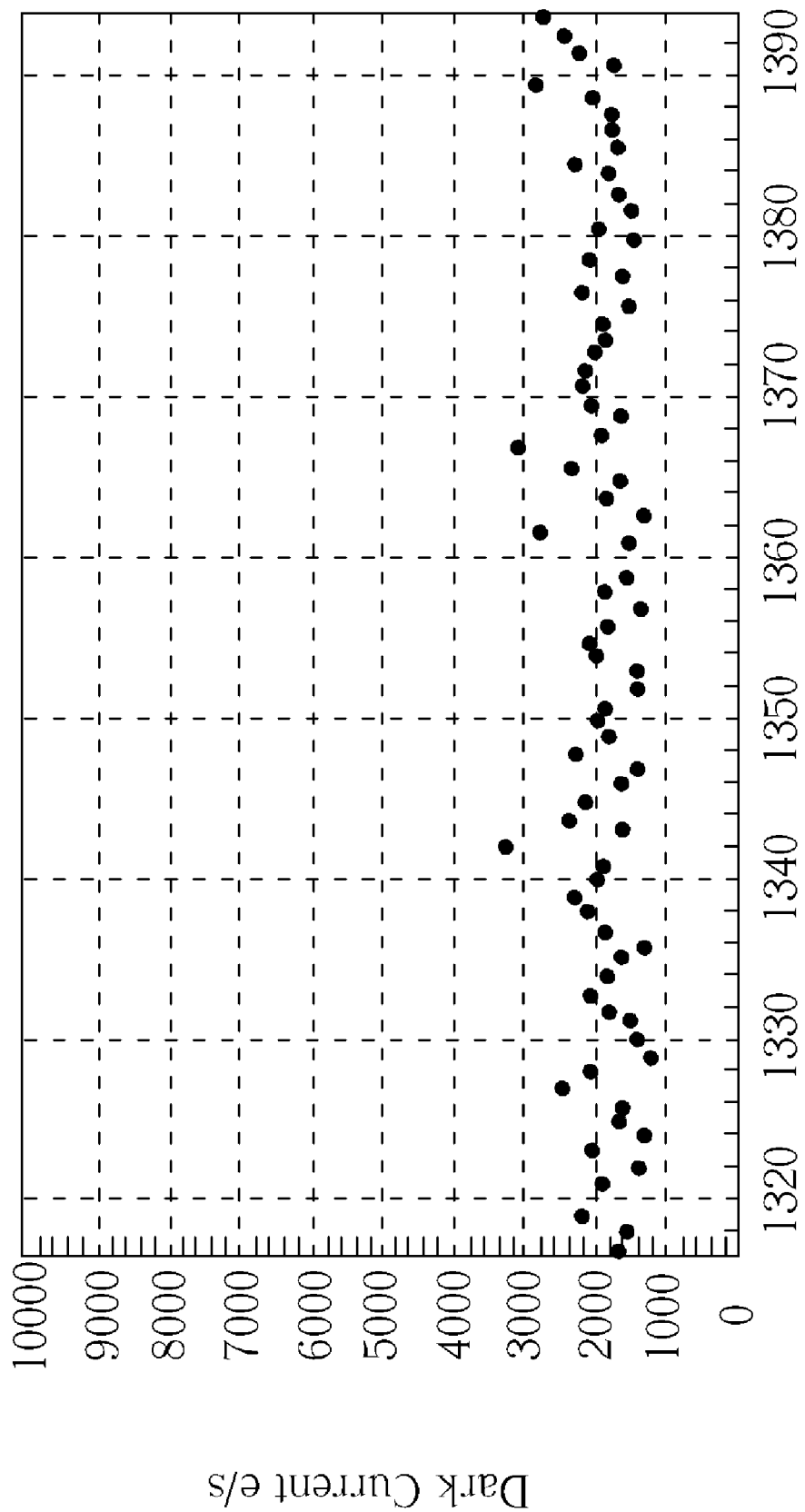

FIGS. 18-21 respectively show the result of measuring dark current at the pixel array region, the optical black region at the right end of the pixel array region, the optical black region at the bottom of the pixel array region, and the optical black region in the right bottom corner of the device of an image sensor device according to the present invention. During the manufacturing, a hydrogen annealing was performed at a flow ratio of hydrogen:nitrogen=2:20 to passivate dangling bonds without a metal light shielding layer presenting in the optical black region, and thus more dangling bonds could be passivated. The dark current shown in FIGS. 18-20 is significantly lower than that in the conventional techniques. The curves shown in FIGS. 18 and 20 do not arise significantly at two ends, indicating that there is almost no difference between the dark current at the edge part and the dark current at the interior part. As shown in FIGS. 19 to 21, the dark current in the optical black region is reduced to be about 1000 to 2000 e/s, and the difference between the dark current in the pixel array region and the dark current in the optical black region is decreased, indicating the image sensor device made by the method of the present invention has an improved dark current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor device, comprising:
    a semiconductor substrate;
    a pixel array region on the semiconductor substrate, the pixel array region comprising a photo sensing unit array;
    a logic region on the semiconductor substrate, the logic region comprising a peripheral circuit; and
    an optical black region between the pixel array region and the logic region on the semiconductor substrate, the optical black region comprising a photo sensing unit on the semiconductor substrate, a first planarized layer on the photo sensing unit, a second planarized layer on the first planarized layer, a passivation layer on the second planarized layer and an optical black layer on the passivation layer.

2. The image sensor device of claim 1, wherein the optical black layer comprises a metal layer formed at a temperature less than 400° C.

3. The image sensor device of claim 2, wherein the metal layer comprises titanium.

4. The pixel array region of claim 2, wherein the metal layer comprises titanium and titanium nitride.

5. The image sensor device of claim 1, wherein the photo sensing unit array comprises a plurality of photodiodes.

6. The image sensor device of claim 1, further comprising a color filter array correspondingly over the photo sensing unit array in the pixel array region.

7. The image sensor device of claim 1, wherein the second planarized layer comprises a plurality of dielectric layers.

8. The image sensor device of claim 1, further comprising a cap oxide layer over the optical black layer.

* * * * *